United States Patent [19]

Ogata et al.

[11] Patent Number: 5,690,742

[45] Date of Patent: Nov. 25, 1997

[54] SUSCEPTOR FOR AN EPITAXIAL GROWTH APPARATUS

[75] Inventors: Kazuro Ogata, Omura; Kazuhisa Iwanaga, Takagi-machi, both of Japan

[73] Assignee: Komatsu Electronic Metals Co., Ltd., Hiratsuka, Japan

[21] Appl. No.: 607,211

[22] Filed: Feb. 26, 1996

[51] Int. Cl.$^6$ .................................................. C23C 16/00
[52] U.S. Cl. ........................................... 118/500; 118/728
[58] Field of Search ................................... 118/725, 728, 118/729, 730, 500

[56] References Cited

U.S. PATENT DOCUMENTS 5,152,842  10/1992  Urata ............................. 118/730

*Primary Examiner*—Richard Bueker
*Attorney, Agent, or Firm*—Varndell Legal Group

[57] ABSTRACT

A susceptor for an epitaxial growth apparatus, which can maximize the surface utilization of the susceptor and increase the number of semiconductor wafers in a single run. The shape of the pocket for loading a semiconductor wafer at a specific position is similar to and slightly larger than that of the semiconductor wafer with an orientation flat. In addition, the pocket is so located that the orientation flat will be close to adjacent semiconductor wafers. Therefore, compared with the conventional one, the distance between centers of adjacent pockets can be reduced and the total number of the semiconductor wafers that can be loaded on the susceptor in the same surface area can be increased. After the epitaxial growth process, the semiconductor wafers can be removed from the susceptor using the notchs on the periphery of the pockets.

5 Claims, 2 Drawing Sheets

SUSCEPTOR FOR AN EPITAXIAL GROWTH APPARATUS

BACKGROUND OF THE INVENTION

1. Field of the Invention

The present invention relates to a susceptor for an epitaxial growth apparatus.

2. Description of Related Arts

In the case of forming epitaxial layers on semiconductor wafers using a vapor-phase epitaxial growth apparatus of longitudinal type, the semiconductor wafers are loaded onto a susceptor. The susceptor is made of carbon coated with SiC, and heated in the reaction chamber into which the reactive gases are supplied at the same time. FIG. 4 (Prior Art) is a plan view of an example of a conventional susceptor, and FIG. 5 (Prior Art) is a cross-sectional view of the susceptor along B—B line in FIG. 4. Susceptor 1 is suitable for five-inch-in-diameter semiconductor wafers. In the Figures, hole 7, located in the center of susceptor 1, is used for inserting a nozzle for supplying the reactive gases. Semiconductor wafers will be loaded into specific positions on the susceptor 1. Round shallow pockets 2 are used for preventing the semiconductor wafers from shifting. The diameter of pockets 2 is slightly larger than that of the corresponding semiconductor wafers. Centers of pockets 2 are uniformly allocated in two concentric circles and spaced apart from each other by a specific distance. Therefore, thirteen pockets are positioned along the periphery of the outer circle and seven are positioned along the periphery of the inner circle, for a total of twenty pockets. Rectangular pocket 8, located on susceptor 1 along the radial direction, is used to load with dummy wafers at a specific position for monitoring film thickness and resistivity during the epitaxial growth process. The depths of the pockets 2 and 8 should be less than 1 mm.

Orientation flats are used for recognizing the crystal orientation and the conducting type of wafers easily and positioning precisely. However, the pockets of the conventional susceptor are round. This means that a crescent-shaped area remains unused in the portion of the orientation flat while a semiconductor wafer is loaded into the pocket. Therefore it is convenient to remove the semiconductor wafers after the epitaxial growth process. However, the unused surplus area degrades the surface utilization of the susceptor. It should be noted that the total ratio of unused surplus area in a susceptor to the susceptor surface area is quite large.

SUMMARY OF THE INVENTION

The purpose of the present invention is to solve such a problem and provide a susceptor for an epitaxial growth apparatus, which can maximize the surface utilization of the susceptor and increase the number of semiconductor wafers in a single run.

The present invention meets this purpose by providing a susceptor for an epitaxial growth apparatus, which comprises a plurality of pockets to be loaded with semiconductor wafers with orientation flats at corresponding positions, characterized in that the shape of the pockets is similar to that of the semiconductor wafers and the orientation flat of one of the semiconductor wafers is close to the neighboring semiconductor wafers, whereby the distance between centers of the adjacent pockets is decreased and the total number of the pockets is increased.

In addition, the susceptor further comprises notches, which are located at the periphery of the pockets and which facilitate the removal of the semiconductor wafers.

In such a susceptor for an epitaxial growth apparatus of the present invention, the shape of the pocket for loading a semiconductor wafer into a specific position is similar to the semiconductor wafer with an orientation flat. In addition, the pocket is so located that the orientation flat will be close to adjacent semiconductor wafers. Thus, there is no space between the periphery of a circular pocket and the orientation flat of the semiconductor wafer. Therefore, compared with the conventional one, the distance between centers of adjacent pockets can be reduced and the total number of the semiconductor wafers loaded on the susceptor in the same surface area can be increased. The semiconductor wafers after the epitaxial growth process, using the notches on the periphery of the pockets, can be removed from the susceptor.

DETAILED DESCRIPTION OF THE PREFERRED EMBODIMENT

Figure 1:
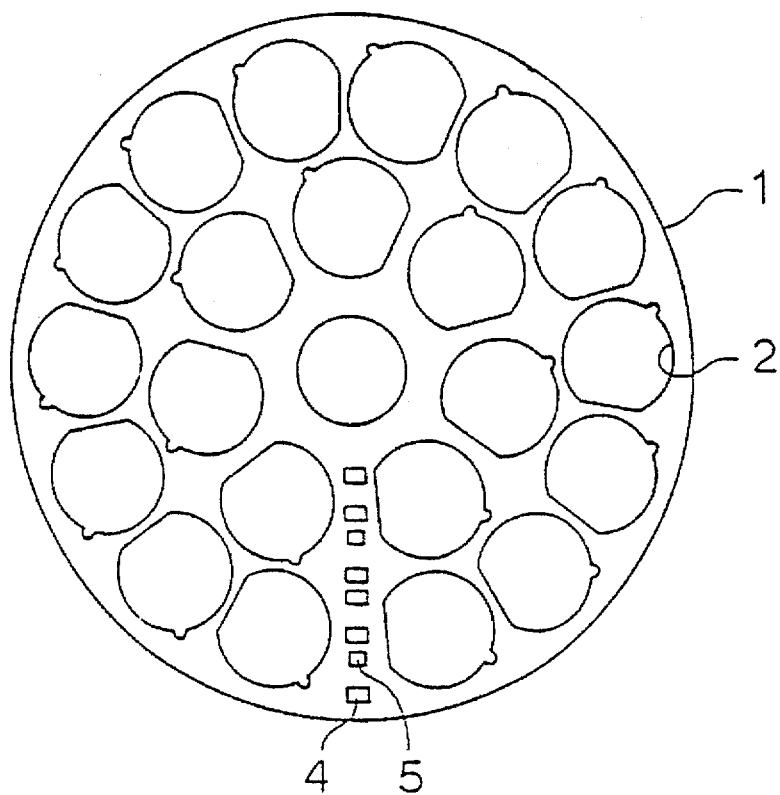
FIG. 1 is a plan view of a susceptor for loading semiconductor wafers.
Figure 2:
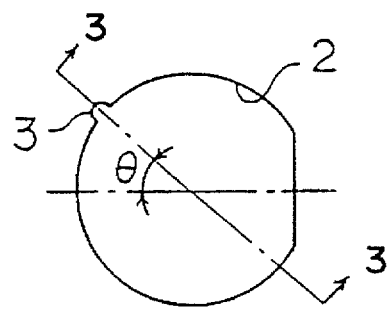
FIG. 2 is a plan view of a pocket located onto the susceptor.

A description of the susceptor for an epitaxial growth apparatus in the present invention is made as follows with reference to the accompanying drawings. FIG. 1 is a plan view of a susceptor, into which five-inch-in-diameter wafers are loaded FIG. 2 is a plan view of a pocket. In FIG. 1 and FIG. 2, disk-shaped suspector 1 is made of silicon coated with SiC. Pockets 2, which in shape are similar to the semiconductor wafers with orientation flats, are uniformly allocated in two concentric circles and spaced apart from each other by a specific distance. Fourteen pockets are positioned along the periphery of the outer circle and seven are positioned along the periphery of the inner circle, for a total of twenty-one pockets, which is clearly one more than that of the conventional susceptor. The diameter of pockets 2 is 126 mm, which is larger than that of semiconductor wafers by 1 mm. Semicircular notch 3 formed on the periphery of pocket 2 facilitates removal of the semiconductor wafer after the epitaxial growth process. The notch 3 is located with an angle θ from the orthogonal center line of the orientation flat. The angle θ is 45° for the pockets located on the outer circle of susceptor 1 and 20° for the pockets located on the inner circle of susceptor 1. Practically, the notch position should not be limited as above. The notch can be located on any position that does not result in contact with the periphery of adjacent pockets.

In addition to the pockets 2 for loading with semiconductor wafers on the susceptor 1, together with a central hole for inserting a nozzle for supplying the reactive gases there are several rectangular pockets 4, 5 on the susceptor 1. Pockets 4 and 5, which are located between pockets 2 along the radial direction of susceptor 1, are used for monitoring the status of the semiconductor wafers during the epitaxial growth process. Bigger pockets 4 can be loaded with dummy wafers used for monitoring the thickness of epitaxial layers, and smaller pocket 5 can be loaded with dummy wafers used for monitoring the resistivity. The pockets 4 and 5 can prevent the dummy wafers used for monitoring from shifting.

Figure 3:
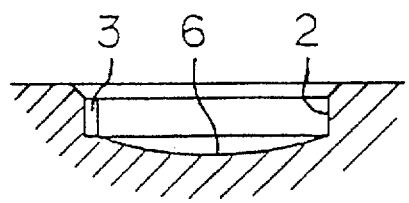
FIG. 3 is a cross-sectional view along A—A line in FIG. 1.
Figure 4:
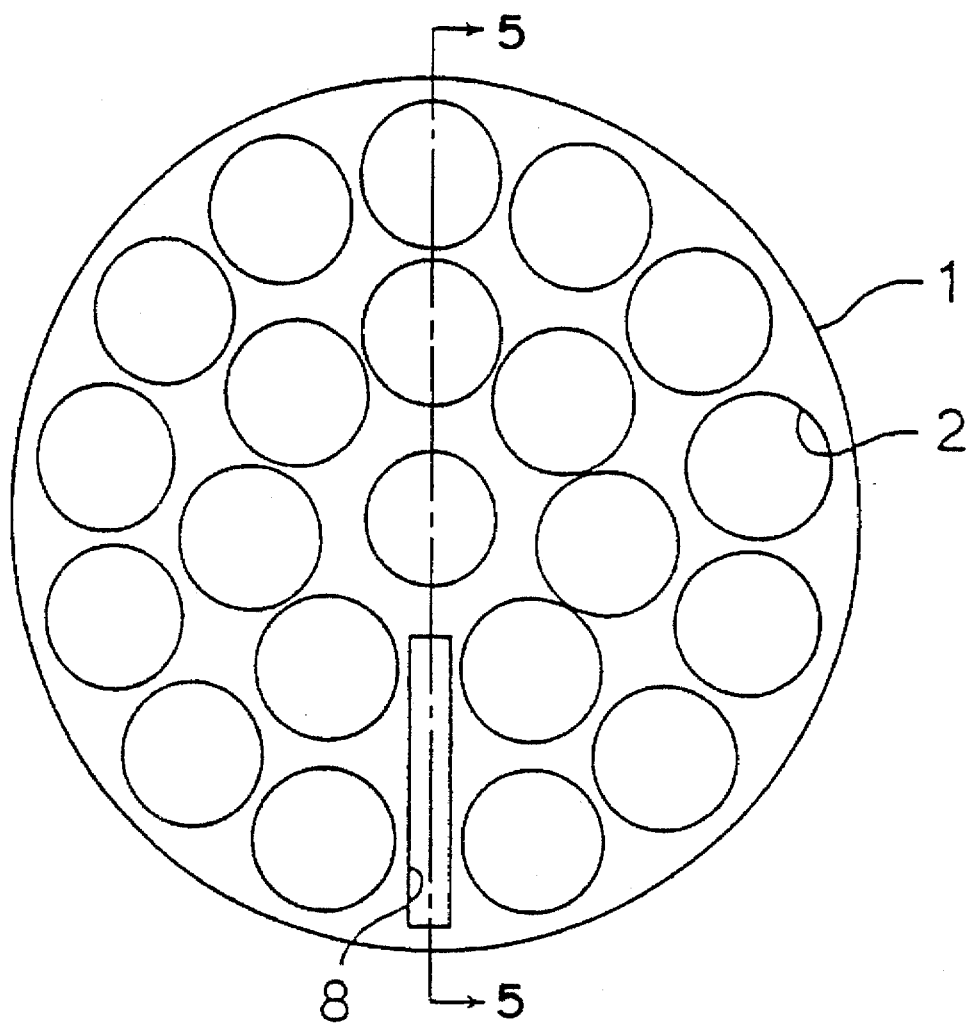
FIG. 4 (Prior Art) is a plan view of a conventional susceptor.
Figure 5:
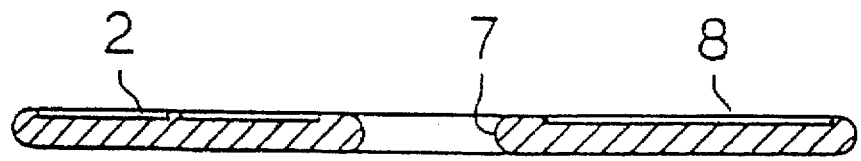
FIG. 5 (Prior Art) is a cross-sectional view along B—B line in FIG. 4.

FIG. 3 is a cross-sectional view of the pocket along A—A line in FIG. 1. The notches 3 have the same depth as the pockets 2. Because semiconductor wafers will be bent into bowl shapes by heating during the epitaxial growth process, a curved-surface 6 corresponding to the deformation is formed on the bottom of the pocket 2 to support the semiconductor wafers.

In the susceptor for an epitaxial growth apparatus of the present invention described as above, the shape of the pocket for loading a semiconductor wafer into a specific position is similar to the semiconductor wafer with an orientation flat. In addition, the pocket is so located that the orientation flat will be close to adjacent semiconductor wafers. Therefore, the surface of the susceptor can be utilized more efficiently and the number of the manipulated semiconductor wafers in a single run also can be increased. The productivity of the epitaxial growth process is thereby increased.

What is claimed is:

1. A susceptor for an epitaxial growth apparatus comprising a plurality of pockets, said pockets adapted for holding semiconductor wafers with an orientation flat, said pockets having a periphery matching that of the semiconductor wafer including a flat edge matching the orientation flat of the semiconductor wafer, whereby a distance between centers of said pockets is reduced and a total number of said pockets is increased within said susceptor relative to pockets for semiconductor wafers having a completely circular periphery.

2. The susceptor of claim 1, wherein said pockets include a notch for removing the semiconductor wafers therefrom.

3. A susceptor for an epitaxial growth apparatus comprising a plurality of pockets for holding semiconductor wafers, said pockets having a periphery comprising a curved edge and a straight edge, and ends of said curved edge are joined to ends of said straight edge, said pockets are circumferentially arranged about said susceptor with said straight edges respectively facing said curved edges of adjacent said pockets.

4. The susceptor of claim 3, wherein said straight edges are oriented along a radius of said susceptor.

5. The susceptor of claim 3, wherein said pockets include a notch for removing the semiconductor wafers therefrom.

* * * * *